United States Patent [19]

Saitoh et al.

[11] Patent Number: 4,489,402
[45] Date of Patent: Dec. 18, 1984

[54] SEMICONDUCTOR MEMORY DEVICE

[75] Inventors: Shinji Saitoh; Junichi Miyamoto; Kazuaki Ichinose, all of Yokohama, Japan

[73] Assignee: Tokyo Shibaura Denki Kabushiki Kaisha, Kawasaki, Japan

[21] Appl. No.: 370,914

[22] Filed: Apr. 22, 1982

[30] Foreign Application Priority Data

Apr. 25, 1981 [JP] Japan .................................. 56-63005
May 29, 1981 [JP] Japan .................................. 56-82115
Jul. 9, 1981 [JP] Japan .................................. 56-106265

[51] Int. Cl.³ ............................................... G11C 7/00
[52] U.S. Cl. .................................................. 365/200
[58] Field of Search ................. 365/200, 210; 371/8, 371/10

[56] References Cited

U.S. PATENT DOCUMENTS 4,047,163 9/1977 Choate et al. ..................... 371/10 X
4,281,398 7/1981 McKenny et al. ................. 365/200
4,310,901 1/1982 Harding et al. .................... 365/200
4,365,319 12/1982 Takemae ............................ 365/200

OTHER PUBLICATIONS

Sakalay, "Correction of Bad Bits in a Memory Matrix", IBM Technical Disclosure Bulletin, vol. 6, No. 10, pp. 1, 2, (Mar. 1964).
Evans et al., "Correction of Memories with Defective Bits", IBM Technical Disclosure Bulletin, vol. 7, No. 6, pp. 436, 437, (Nov. 1964).

Primary Examiner—Joseph A. Popek
Attorney, Agent, or Firm—Finnegan, Henderson, Farabow, Garrett and Dunner

[57] ABSTRACT

A semiconductor memory device provides redundancy using a decoder which examines a memory address and outputs the contents of memory at that address if the decoder determines that the address signal is selecting a correct bit cell in the memory, or clamps the output at a predetermined level if the decoder determines that the address signal is selecting an error bit cell in the memory.

1 Claim, 11 Drawing Figures

FIG. 6
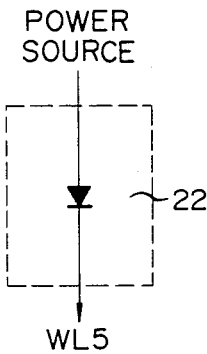
FIG. 7
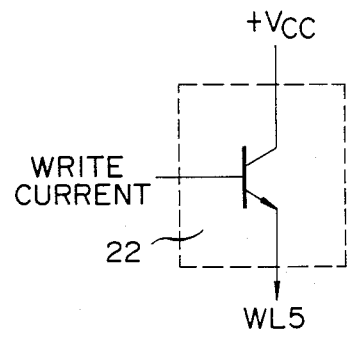
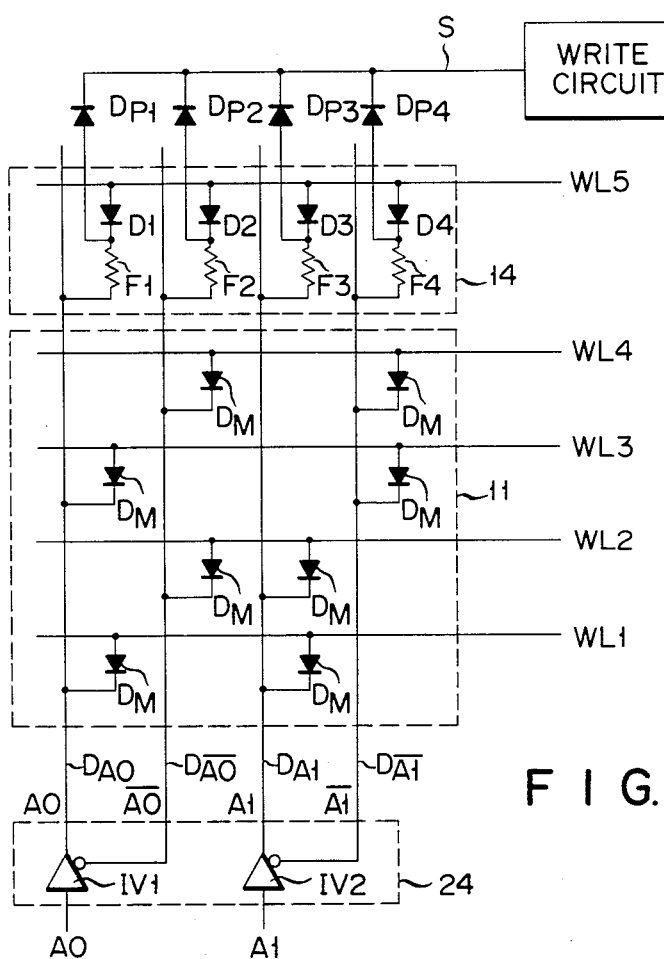
FIG. 8

SEMICONDUCTOR MEMORY DEVICE

BACKGROUND OF THE INVENTION

The present invention relates to a semiconductor memory device with redundancy.

In the recent semiconductor memory devices with a high density integration and a large memory capacity, a variation in the manufacturing process or dust contained in air frequently provides an imperfect etching process, which increases bit errors in the memory. This results in deterioration of the production yield. In the case of the programmable read only memory (PROM) of the melting type, because of a variation in the working accuracy, the fuse fails to be melted, causing an bit error. In the case of the PROM of 4 Kbit, for example, a percentage of occurences of defective articles is about 5 to 10%.

To solve such write error problem, there is proposed a memory device which uses a redundancy circuit to rescue a read error based on the bit error. FIG. 1 shows a memory device with the redundancy circuit. In FIG. 1, reference numeral 1 designates a decoder circuit for decoding an address signal $A_R$ in a row direction; 2 a decoder circuit for decoding an address signal $A_C$ in a column direction; 3 a main memory (cell group) which is addressed by the address signals produced from the decoder circuits 1 and 2; 4 an auxiliary memory (cell group) providing a redundancy bits; 5 a switch for connecting or disconnecting a decode line connecting to the decoder circuit 1 and a word line connecting to the main memory 3; 6 a switch for connecting or disconnecting a decode line of the decoder circuit 1 and a word line connecting to the auxiliary memory 4; 7 a switch for selecting output data from the main memory and the output data from the auxiliary memory.

Let us consider the address signal $A_R$ in a row direction in the memory device constructed as such. The address signal $A_R$ is decoded by the row decoder 1 and is then applied into the word lines of the main memory 3 through the switch 5 being in an ON state (indicated by a solid line). A single word line, e.g. $WL_M$, is selected on the basis of the contents of the row address signal $A_R$. When an error bit or an incorrect bit is contained in any one of the main memory cells arranged on the word line $WL_M$, the switch 5 is turned off, as indicated by a dotted line, to disconnect the decoder line $DL_M$ leading to the decoder circuit 1 from the word line $WL_M$ of the main memory 3. At the same time, the switch 6 is turned on, as indicated by a dotted line, to connect the decode line $DL_M$ to the word line $WL_A$ of the auxiliary memory 4. Through this switching operation, the memory cells 9 in the auxiliary memory 4 are selected. In this case, if any one of the memory cells 9 in the auxiliary memory 4 has no error bit, the main memory 3 having the bit error in the memory cell 8 is repaired.

The prior memory device of this type employs the same number of auxiliary memory cells as those of the main memory to repair the main memory cell respective of which word line or how many word lines contain the error bit cell or cells. The prior art further employs multiplexers complicated in construction and operation for the switches 5 to 7, as shown in FIG. 2.

There is another proposal of a semiconductor memory device with redundancy. The memory device employs a more complicated switch control system for the main and auxiliary memories having a further number of switches. However, in the memory device, the number of memory cells in the auxiliary memory is limited to that of the memory cells on one word line in the main memory. In this respect, the chip area occupied by the auxiliary memory is remarkable reduced, compared with the former prior art memory device.

The former memory device has infrequently been used because it needs substantially the chip area two times that of the memory device with no auxiliary memory. For this reason, the latter means has dominantly been used; however, it needs the auxiliary memory cells of which the number is the same as that of those on one row line, even if the error bit cell on the word line of the main memory 3 is one. Accordingly, the chip area necessary for the auxiliary memory is still large. Further, the switch control system is more complicated than the former prior art.

SUMMARY OF THE INVENTION

Accordingly, an object of the present invention is to provide a semiconductor memory device with a redundancy system which is simple in construction, small in its occupying area, and repairs the error bit contained in memory.

According to the present invention, there is provided a semiconductor memory device comprising a main memory for storing data, a first decoder circuit which receives an address signal to decode the address signal and designates an address in the main memory by the decoded address signal, a sense circuit for sensing data of the main memory, a second programmable decoder circuit which receives the address signal received by the first decoder circuit, produces an output signal at a first logic level when the address signal is for designating an address of a correct bit cell in the main memory, and produces an output signal at a second logic level when the address signal is for designating an address of an error bit cell of the main memory, and a logic circuit for producing correct data under control of the logic output signal from the second decoder circuit.

BRIEF DESCRIPTION OF THE DRAWINGS

FIGS. 6 and 7 show detailed diagrams of a data write circuit used in the FIG. 5 circuit;

FIG. 8 shows a circuit diagram of another modification of the decoder circuits;

DETAILED DESCRIPTION OF THE PREFERRED EMBODIMENTS

Figure 1:
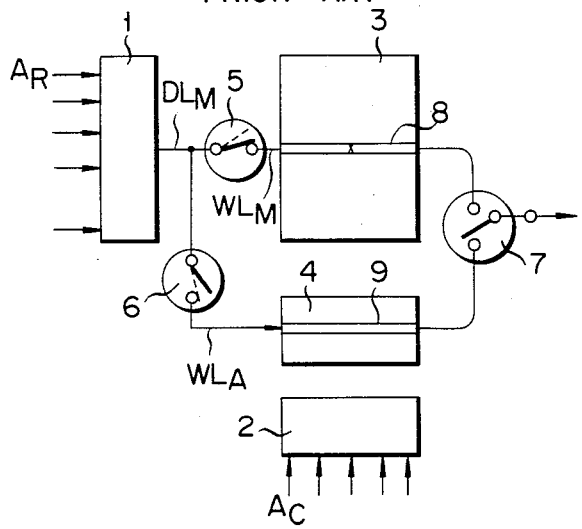
FIG. 1 shows a prior semiconductor memory device.
Figure 2:
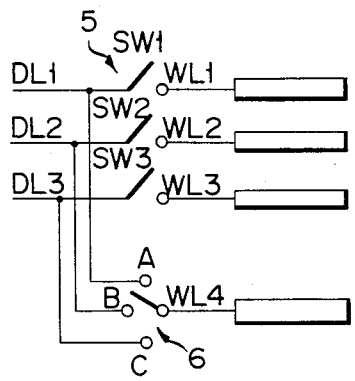
FIG. 2 shows a schematic diagram of switches 5 and 6 used in the memory device shown in FIG. 1.
Figure 3:
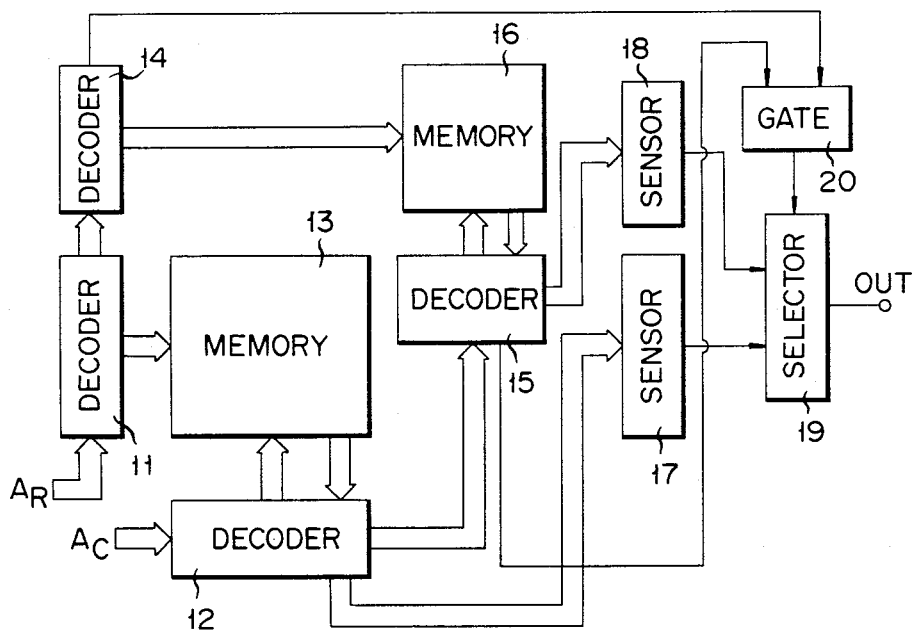
FIG. 3 shows an embodiment of a semiconductor memory device according to the present invention.

Referring to FIG. 3, there is shown an embodiment of a memory device according to the present invention. In the figure, reference numeral 11 designates a first row decoder circuit for decoding a row address signal $A_R$;

12 a first column decoder circuit for decoding a column address signal $A_C$; 13 a main memory addressed by the address signals $A_R$ and $A_C$ derived from the decoder circuits 11 and 12. The main memory 13 comprises a plurality of memory cells for storing data. Reference numeral 14 designates a second row decorder circuit for decoding only a given address signal when it receives the row address signal $A_R$. Reference numeral 15 stands for a second column decoder circuit for decoding only a given column address signal when it receives the address signal $A_C$. Reference numeral 16 represents an auxiliary memory addressed by the address signal decoded by and transferred from the second row decoder circuit 14 and the second column decoder circuit 15 and repairs the bit error in the main memory 13.

The auxiliary memory 16 comprises a plurality of memory cells each of which stores data. Reference numeral 17 designates a first sense circuit for detecting data from the main memory cell which is addressed and read out by the decoded address signals derived from the first row decoder circuit 11 and the first column decoder circuit 12; 18 a second sense circuit for detecting data from the auxiliary memory cell addressed and read out by the decoded address signals from the second row decoder circuit 14 and the second column decoder circuit 15; 19 a selection circuit for selectively drawing output data from the sense circuits 17 and 18 to the terminal OUT in response to the output signals from the gate (described later); 20 an AND gate which receives outputs from the second decoder circuits 14 and 15 to AND the outputs and to control the gate of the gate circuit 19.

The operation of the memory device as shown in FIG. 3 will be described. Assume now that the row address signal $A_R$ is inputted to the first row decoder circuit 11 and the second row decoder circuit 14, and that the column address signal $A_C$ is inputted to the first column decoder circuit 12 and the second column decoder circuit 15. The first row decoder circuit 11 and the first column decoder circuit 12 decode the row and column address signals $A_R$ and $A_C$, respectively. The decoded address signals $A_R$ and $A_C$ are inputted to the word line (row line) and the bit line (column line) of the main memory 13, respectively, and designate an address in the main memory. The data stored in the address specified are sensed by the first sense circuit 17. The second row decoder circuit 14 and the second column decoder circuit 15 decode address signals $A_R$ and $A_C$ for designating an address of the memory cell having an error bit in the row address memory 13, that is to say, for selecting the error bit cell.

The decoded address signal is inputted to the auxiliary memory 16 and the word line (row line) and the bit line (column line) of the auxiliary memory 16 to designate an address in the auxiliary memory 16. The data stored in the memory cell of the specified address is sensed by the second sense circuit 18. The data sensed by the first and second sense circuits 17 and 18 are inputted to the selection circuit 19. The selection circuit 19 is controlled by the logic output signal from the AND gate 20. When the address signals $A_R$ and $A_C$ do not designate or select the address of the error bit cell in the main memory 13, the logic level of either or both of the logic output signals derived from the second row and column decoder circuits 14 and 15 is "0". Therefore, since the output signal from the AND gate 20 is logic "0", the selection circuit 19 transfers the data from the first sense circuit 17, i.e., the data from the main memory 13, to the output terminal OUT. Conversely, when the address signals $A_R$ and $A_C$ designate or select the address of the error bit cell, the logic level of the signals from the second row and column decoder circuits 14 and 15 is "1", so that the output signal from the AND gate 20 is logic "1".

Accordingly, the selection circuit 19 transfers the data from the second sense circuit 18, i.e., the data from the auxiliary memory 16, to the output terminal OUT. When the memory cell having correct data is selected, the data is produced from the main memory 13. On the other hand, when the main memory cell having the erroneous bit or the error bit cell is selected, the data is produced from the auxiliary memory 16. The logic output signals produced from the decoder circuits 14 and 15 will be described later.

The present invention will more specifically be described referring to a circuit arrangement of first and second row decoders 11 and 14 shown in FIG. 4. For simplicity of explanation, the circuit is designed to be of the two-bit type. The first row decoder circuit 11 is a matrix circuit in which active elements are provided at the cross points of the row address lines (row decode lines) $D_{A0}$, $D_{\overline{A0}}$, $D_{A1}$ and $D_{\overline{A1}}$ and the row lines WL1, WL2, WL3 and WL4 so as to have binary information of 4 bits. Similarly, the second row decoder circuit 14 is a matrix circuit in which active elements and data storable elements are provided at the cross points of the row address lines $D_{A0}$, $D_{\overline{A0}}$, $D_{A1}$ and $D_{\overline{A1}}$, and the word line WL5. The active elements in the first row decoder circuit 11 are diodes, for example, and the data storable elements in the second row decoder circuit 14 are fuse elements, for example. The arrangements of the column decoder circuits 12 and 15 are substantially the same as those shown in FIG. 4, and hence no further explanation will be given.

The operation of the memory device shown in FIG. 3 will be described referring to the decoder circuit arrangements shown in FIGS. 4A and 4B.

Assume that a cell having an error bit is contained in the main memory cells on the word line WL1. In this case, for repairing the bit error, the address signals $A_R$ and $A_C$ for selecting the error bit cell cooperate to specify the memory cell at the corresponding address of the auxiliary memory 16. To this end, a program (data) stored at the cross points of the word lines WL5 and the row address lines $D_{A0}$, $D_{\overline{A0}}$, $D_{A1}$ and $D_{\overline{A1}}$ must be coincident with the program (data) at the cross points of the word line WL1 and the address lines $D_{A0}$, $D_{\overline{A0}}$, $D_{A1}$, and $D_{\overline{A1}}$, respectively. In order for the program on the word line WL1 to coincide with that on the word line WL5, the fuses at the cross points of the word line WL5 with the row address lines $D_{\overline{A0}}$ and $D_{\overline{A1}}$ must be melted, since the word line WL1 is connected with the row address lines $D_{A0}$ and $D_{A1}$ at those cross points, and it is not connected with the row address lines $D_{\overline{A0}}$ and $D_{\overline{A1}}$ at those cross points. With this arrangement, when the word line WL1 of the main memory having the error bit cell is selected, the word line WL5 of the auxiliary memory 16 is selected simultaneously.

Although not shown, the similar fuse melting operation is performed in the bit line (column line) of the main memory 13. As a result, when the address signals $A_R$ and $A_C$ used to select the error bit cell on the word line WL1 in the main memory 13 are applied to the main memory 13, the cell at the address corresponding to the error bit cell on the word line WL5 connected to the auxiliary memory 16 is selected. Accordingly, the data in the memory cell corresponding to the error bit cell of the main memory 13 on the word line WL5 in the auxiliary memory 16 is detected.

When the word line WL5 is selected, the logic level is "1". The logic level on the word line WL5 is that of the logic output signal of the decoder circuit 14. Similarly, the logic level on the bit line connected to the corresponding cell is also logic "1". The logic level on the bit line is that of the logic output signal of the decoder circuit 15 as described above. Accordingly, data in the corresponding cell of the auxiliary memory 16 is outputted to the output terminal of the selection circuit 19. In this way, by previously loading correct data into the corresponding cell in the auxiliary memory 16, the bit error in the main memory 13 can be repaired.

In the memory device of the present embodiment, the arrangements of the decoder circuits 14 and 15 for the auxiliary memory 16 are very simple and the switching between the main memory 13 and the auxiliary memory 16 is very easy. In the memory device of the above-mentioned embodiment, the memory capacity of the auxiliary memory 16 is satisfied by provision of the memory cells of which the number corresponds to that of the bits specified by the decoder circuits 14 and 15 for the auxiliary memory 16. The one bit error in the main memory 13 can be repaired by the auxiliary memory cell of one bit. In this respect, the occupation area by the auxiliary memory in the IC chip is small.

In the above embodiment, one memory cell is provided corresponding to one bit selected by the row and column decoder circuits 14 and 15. The present invention is easily applied for a system in which the auxiliary memory cells of one word line are selected corresponding to the memory cells on one word line containing an error bit. This is realized when the auxiliary memory cells of one word line are selected, the information signals for indicating that the decoder circuits of the auxiliary memory are selected are generated thereby to render all the decoder circuits of the main memory nonconductive. In this case, the control of the selection of the decoder circuit in the main memory is performed by using a further selection decode line in addition to the decode lines of the main memory.

Figure 5:
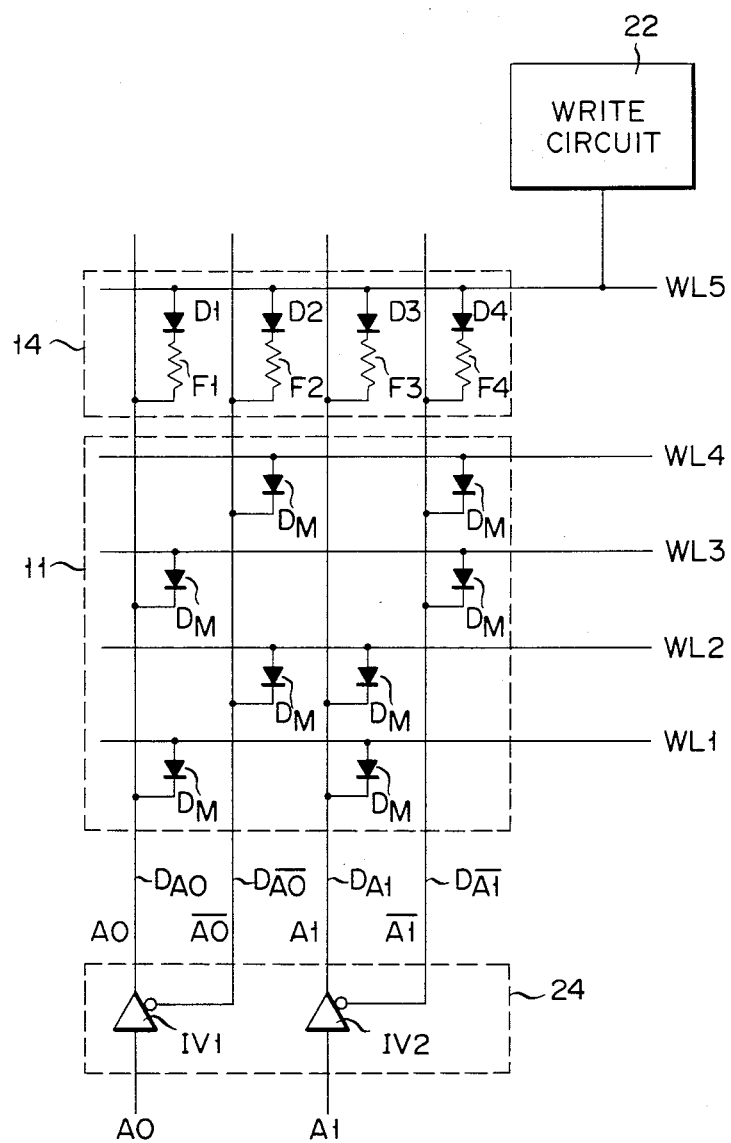
FIG. 5 is a circuit diagram of a modification of the decoder circuit.

FIG. 5 illustrates an arrangement of the first and second row decoder circuits 11 and 14, which has a write circuit 22 for writing data into data strorable elements on the word line WL5 connected to the auxiliary memory 16. The address signal input circuit 24 comprises inverters IV1 and IV2 which receive the address signals A0 and A1 to produce two couples of signals A0 and $\overline{A0}$ and A1 and $\overline{A1}$, which are in or out-of phase of the input signals, respectively.

Diodes $D_M$ are selectively connected to the cross points in the matrix comprising the word lines WL1 to WL4 and the row address lines $D_{A0}$, $D_{\overline{A0}}$, $D_{A1}$ and $D_{\overline{A1}}$. The diodes $D_M$ are connected at the anodes to the word lines and at the cathodes to the row address lines. The cross points in the matrix comprising the word line WL5 and the row address lines $D_{A0}$, $D_{\overline{A0}}$, $D_{A1}$, and $D_{\overline{A1}}$, constituting the second row decoder circuit 14, are connected to series circuits each including a diode and a programmable element, for example, a meltable element such as a fuse. The diode of the series circuit has its anode connected to the word line WL5 and has its cathode connected to the row address lines through the programmable element.

The cross points of the word line WL5 with the row address lines $D_{A0}$, $D_{\overline{A0}}$, $D_{A1}$, and $D_{\overline{A1}}$ are connected to the series circuit of the diode D1 and the programmable element F1, the series circuit of the diode D2 and the programmable element F2, and the series circuit of the diode D3 with the programmable element F3, and the series circuit of the diode D4 with the programmable element F4. The word line WL5 connected to the auxiliary memory 16 is connected to the write circuit 22 for writing a given program (data) into the programmable elements F1 to F4. The write circuit 22 may be, for example, a diode circuit as shown in FIG. 6, to allow the write current flowing to the word line WL5 through the diode. Alternatively, the write circuit 22 may be a transistor circuit as shown in FIG. 7. In this case, the transistor is driven to feed an emitter current as the write current into the word line WL5.

In the decoder circuit as shown in FIG. 5, any one of the word lines is selected by a proper combination of these row address signals A0, $\overline{A0}$, A1 and $\overline{A1}$. When none of the fuse elements F1 to F4 is melted, the word line WL5 is not selected. Accordingly, the auxiliary memory 16 is not selected. For example, when the logical levels of the row address signals A0, $\overline{A1}$, A1 and $\overline{A1}$ are; A0="1", $\overline{A0}$="0", A1="1" and $\overline{A1}$="0", only the word line WL1 is at high potential or at logical "1" and selected. In this case, the word lines WL5 is at low potential or logical "0" and not selected.

Assume that an error bit cell is contained in the main memory cells connected to the word line WL1. The explanation to follow is how to write the same program as that of the word line WL1 into the word line WL5 connected to the auxiliary memory 16, in order to repair error bit cell. The same program is attained by making the data at the cross points of the word line WL5 with the row address lines $D_{A0}$, $D_{\overline{A0}}$, $D_{A1}$, and $D_{\overline{A1}}$ coincident with the data at the cross points of the word line WL1 with the row address lines $D_{A0}$, $D_{\overline{A0}}$, $D_{A1}$ and $D_{\overline{A1}}$. In more particular, the diode $D_M$ is connected to the word line WL1 only at the cross points of the row address lines $D_{A0}$ and $D_{A1}$. Accordingly, in order to set up the same program, of those fuses F1 to F4, the fuses F2 and F4 are melted, while the fuses F1 and F3 are left intact.

For melting the fuses F2 and F4, the signals having the same logical levels as those of the row address signals A0, $\overline{A0}$, A1, and $\overline{A1}$ to select the word line WL1, are applied to the row address lines $D_{A0}$, $D_{\overline{A0}}$, $D_{A1}$ and $D_{\overline{A1}}$, respectively. As recalled, the logical levels of these signals are "1", "0", "1" and "0", respectively. Under this condition, the write circuit 22 is driven to feed a large current into the word line WL5 and through the fuses F2 and F4. Then, the fuses F2 and F4 are melted. In this way, the same program as that on the word line WL1 is written into the word line WL5. Accordingly, when the word line WL1 connected to the error bit cell in the main memory 13 is selected, the word line WL5 is also selected, with the result that data is read out from that memory cell in the auxiliary memory 16 connected to the word line WL5, which corresponds to the error bit cell in the main memory 13. Therefore, if the contents of the corresponding cell is correct, the bit error in the main memory 13 is repaired by detecting the contents or data in the corresponding cell.

The write circuit 22 may be provided for a single fuse or a pair of row lines. The latter case is satisfactory with a small drive ability. The arrangements of the first column decoder 12 and the second column decoder circuit 15 are substantially the same as that of the first row decoder circuit 11 and the second row decoder circuit 14, as shown in FIG. 5.

Figure 9:
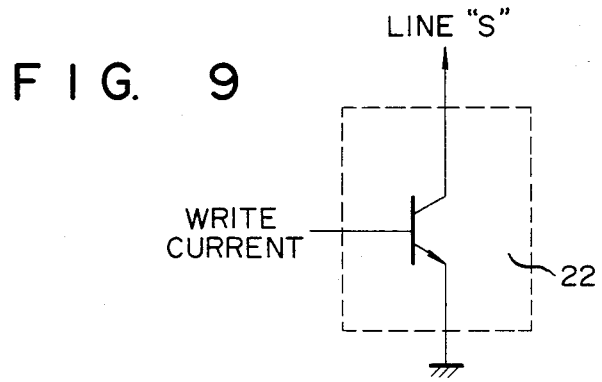
FIG. 9 shows a detailed diagram of a data write circuit.

Turning now to FIG. 8, there is shown a modification of the decoder circuit arrangement shown in FIG. 5. In the present embodiment, the write circuit 22 is connected not to the word line WL5, but to the junction points of the diodes with the fuse elements, which are connected in series between the word line WL5 and the row address lines through the diodes Dp1 to Dp4. As shown, the write line S is led from the write circuit 22 and the diodes Dp1 to Dp4 are connected between the write line S and the junction points between the diodes and the fuse elements. The diodes Dp1 to Dp4 are connected at the anodes to the junction points between the diodes and the fuses, and at the cathodes to the write line S. The remaining portion of the circuit is the same as that of the FIG. 5 circuit. The write circuit may be formed of the transistor having the emitter connected to ground and the collector connected to the write line S as shown in FIG. 9.

The circuit arrangement of FIG. 8 is featured by the write operation of the program into the fuses F1 to F4 as programmable elements. In the circuit arrangement shown in FIG. 5, for writing the same program as that on the word line WL1 into the word line WL5, the signal with the same logical level as that of the row address signal is applied to the row address lines. In the circuit arrangement shown in FIG. 8, the signal at the opposite logical level to that of the row address signal is applied to the address lines. Under this condition, the write circuit 22 is operated to selectively melt the fuses F1 to F4 connected to the word line WL5. In this way, the same program as that of the word line WL1 is written into the word line WL5. More specifically, when the row address signals A0, $\overline{A0}$, A1 and $\overline{A1}$ have the logical levels, "1", "0", "1" and "0", the word line WL1 containing an error bit cell is selected. At this time, the signals having the opposite logical levels to those as just mentioned, i.e. A0="0", $\overline{A0}$="1", A1="0" and $\overline{A1}$="1", are applied to the row address lines $D_{A0}$, $D_{\overline{A0}}$, $D_{A1}$ and $D_{\overline{A1}}$, respectively, and the write circuit 22 is driven.

When the write circuit 22 operates, the logical level on the write line "S" is "0", so that a large current flows into the row address lines $D_{\overline{A0}}$ and $D_{\overline{A1}}$, which are logical "1", through the fuse F2 and the diode Dp2, and the fuse F4 and the diode Dp4. As a result, the fuses F2 and F4 are melted and the same program data as that on the word line WL5 is written for the word line WL1.

Accordingly, like the circuit shown in FIG. 5, when the word line WL1 having the error bit cell is selected, the word line WL5 connected to the auxiliary memory 16 is also selected simultaneously. The bit error in the main memory 13 can be repaired by detecting data from the cell in the auxiliary memory 16 connected to the word line WL5, which corresponds to the error bit cell in the main memory 13.

Also in this circuit, the write circuit 22 may be provided one for one fuse or one for a pair of the decode lines.

In the circuit of the present embodiment, like the circuit of FIG. 5, the program may easily be written into the cells of the decoders 14, 15 through the melting of the fuses. Accordingly, the present embodiment provides a redundancy system with an easy switch between the main memory 13 and the auxiliary memory 16 and with a high integration density.

While in the circuits shown in FIGS. 5 and 8 the diode matrix circuit is employed for the first row decoder circuit 11, the multi-emitter transistor may be used for the circuit 11. This is true for the first column decoder circuit 12 (not shown). The second row decoder circuit 14 for auxiliary memory 16 is of course applicable not only for the single row as shown in FIGS. 5 and 8, but also for two or more rows. Further, the circuit arrangement shown in FIG. 5 or 8 is of the two-bit type, but may be of two or more bits type. While the address signals from the decoder circuits 11 and 14 are directly coupled with the word lines WL1 to WL5, these signal may be coupled with them via the word lines WL1 to WL5.

In the decoder circuit shown in FIGS. 5 and 8, the programmable elements such as fuses are disposed at the cross points of the address lines to which the address signals for addressing both the main and auxiliary memories 13 and 16 and the word line connected to the auxiliary memory 16. When the word line connected to the main memory contains the error bit cell, the same program as that on the word line containing the error bit cell is loaded into the programmable element. With this arrangement, when the word line containing the error bit cell is selected, the word line connected to the auxiliary memory 16 is selected to make an access to the memory cell at the address corresponding to that in the auxiliary memory 16. Accordingly, the switch between the main and auxiliary memories is easy and the semiconductor memory device is capable of rescuing the error bit and suitable for high integration density.

Figure 10:
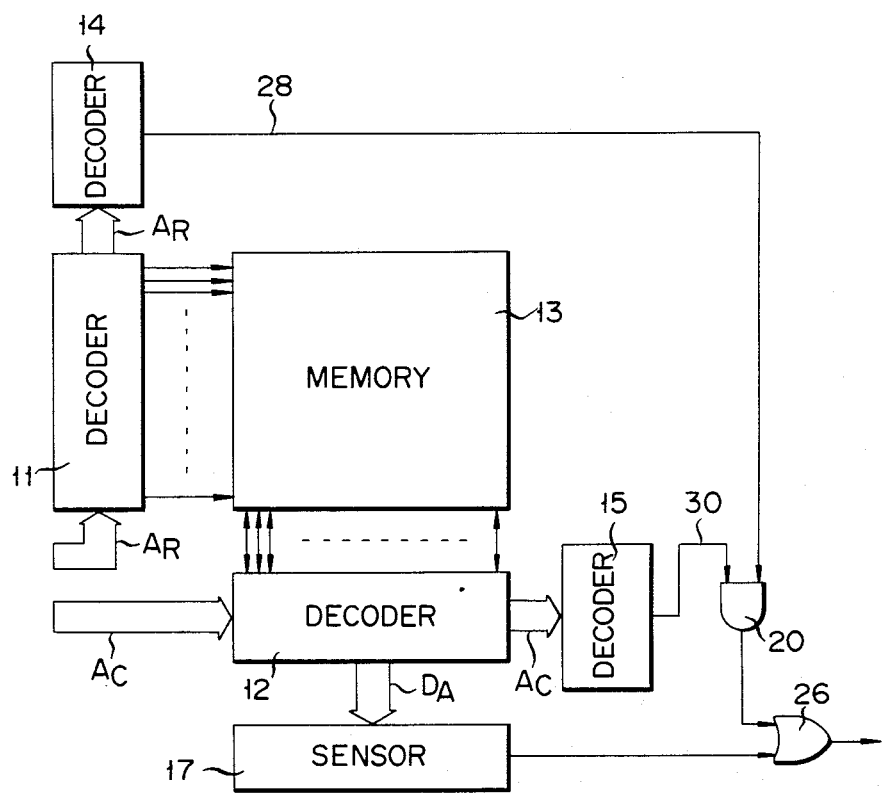
FIG. 10 shows a circuit diagram of another embodiment of a semiconductor memory device according to the present invention.

FIG. 10 shows another embodiment of the present invention. In the present embodiment, the present invention is applied for rescuing the error bit or bits in a read only memory (ROM). For simplicity of the explanation, like reference symbols are used for designating like portions in FIG. 3.

In the main memory 13, for example, a PROM, the memory cells are all set to "0" in an initial stage. In a write mode, binary data is written into proper addresses of the main memory 13. In a read mode, the address signals $A_R$ and $A_C$ cooperatively specify a desired address in the memory. In the present embodiment, if the contents in the memory cell having no written data is "0" and the contents in the memory cell having the written data is "1", the change in the information is only "0" to "1". Accordingly, the auxiliary memory 16 and the second sense circuit 18, which are used in the embodiment of FIG. 3, are not necessary. An OR gate 26 in place of the selection circuit 19 is used. The remaining portion of the present embodiment is the same as the corresponding portion of the FIG. 3 embodiment.

The operation of the FIG. 10 embodiment will be described. In the description to follow, the different portion from the FIG. 4 embodiment will be described while omitting or briefing the portion duplicated with that about the embodiment of FIG. 4.

An address in the main memory 13 is designated by the decoded row address signal $A_R$ from the first row decoder circuit 11 and the decoded column address signal $A_C$ from the column decoder circuit 12. The data loaded into the memory cell at the address is sensed by the sense circuit 17 through the first row decoder circuit 12. The output data is produced through the OR gate 26 to the output terminal OUT. The row address signal $A_R$ and the column address signal $A_C$ applied to the first row decoder circuit 11 and the first column decoder circuit 12 are applied to the first and second programmable decoder circuits 14 and 15 (which are the row address decoder circuit and the column address decoder circuit, respectively) for giving a redundancy to the main memory 13. The output signals from the second decoder circuits 14 and 15 are inputted to the AND gate 20 through the signal lines 28 and 30. The AND gate 20 makes a logical product of the input signals. The output signal from the AND gate 20 is produced to the output terminal OUT through the OR gate 26.

Figure 4A:
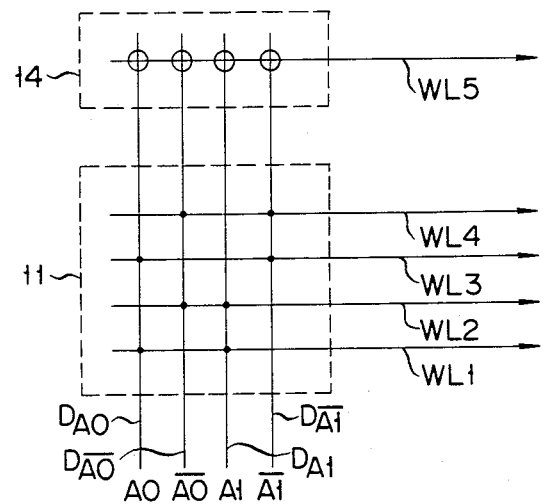
FIGS. 4A and 4B show decoder circuits in use for the memory device shown in FIG. 3.
Figure 4B:
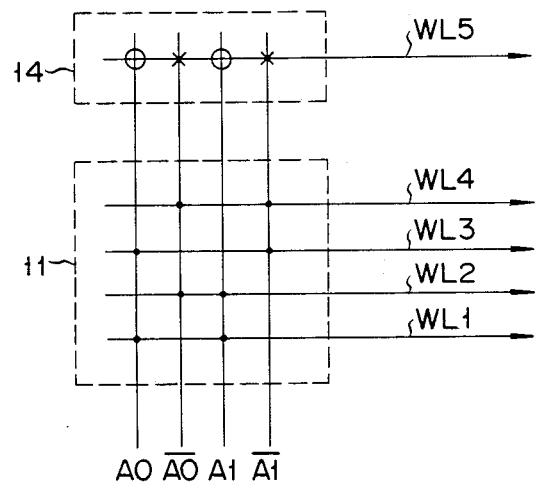

The arrangement of the first row decoder circuit 11 and the second row decoder circuit 14 is the same as that shown in FIGS. 4A and 4B. The arrangement of the first column decoder circuit 12 and the second column decoder circuit 15 is substantially the same as that shown in FIGS. 4A and 4B, if the word lines WL1 to WL5 are bit lines, and the row address lines $D_{A0}$–$D_{\overline{A1}}$ are column address lines. Accordingly, if the address signals $A_R$ and $A_C$ select the memory cell having the correct bit contents (data) in the main memory 13, the output signals from the second decoder circuits 14 and 15 are logical "0". Accordingly, the output signal from the AND gate 20 is logical "0" and the output signal from the sense circuit 17, that is, the data output read out from the main memory 13 is outputted through the OR gate.

Conversely, when the address signals $A_R$ and $A_C$ select the error bit cell in the main memory 13, the logic level of the output signals from the second decoder circuits 14 and 15 are "1", as in the embodiment as previously described. Accordingly, the output signal from the AND gate is also logic "1" and the logic "1" is produced through the OR gate. Although the output signal from the sense circuit 17 is logic "0", the second decoder circuits 14 and 15 drive the AND gate 20 and the logical "1" is produced through the OR gate 26. In other words, by the output signals from the second decoder circuits 14 and 15, the output data from the main memory 13 is clamped so that the correct data may be obtained through the OR gate 26. In this way, the error bit cell in the main memory 13 is rescued, thereby to obtain the correct data.

It is evident that the present invention is not limited to the 2-bit type semiconductor memory but may be two or more bits type ones.

It should be understood that the present invention is not limited to the above mentioned specific embodiments, but may variously be modified or changed within the scope of the present invention.

What we claim is:

1. A semiconductor memory device comprising:

a memory for storing data;

a first decoder circuit for receiving an address signal to decode and designate an address of said memory;

a sense circuit for sensing data stored in said memory at said designated address;

a second decoder circuit for receiving said address signal and for producing a logic output signal at a first logic level if said address signal is for selecting a correct bit cell in said memory and for producing an output signal at a second logic level if said address signal is for selecting an error bit cell in said memory; and logic circuit means for receiving the data sensed by said sense circuit and the logic output signal from said second decoder circuit, and for transmitting the sensed data from said sense circuit without change when the logic output signal from said second decoder circuit is at said first level, and for clamping said sensed data at a predetermined level when said logic output signal is at said second logic level.

* * * * *